US011054755B2

(12) United States Patent
Hartjes et al.

(10) Patent No.: US 11,054,755 B2
(45) Date of Patent: Jul. 6, 2021

(54) OPTICAL MODULE WITH AN ANTICOLLISION DEVICE FOR MODULE COMPONENTS

(71) Applicant: Carl Zeiss SMT GmbH, Oberkochen (DE)

(72) Inventors: Joachim Hartjes, Aalen (DE); Alexander Wolf, Essingen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 330 days.

(21) Appl. No.: 16/269,942

(22) Filed: Feb. 7, 2019

(65) Prior Publication Data

US 2019/0171118 A1    Jun. 6, 2019

Related U.S. Application Data

(63) Continuation of application No. PCT/EP2017/070056, filed on Aug. 8, 2017.

(30) Foreign Application Priority Data

Aug. 9, 2016    (DE) ..................... 10 2016 214 785.4

(51) Int. Cl.
*G03F 7/20* (2006.01)
*G03F 7/00* (2006.01)
(Continued)

(52) U.S. Cl.
CPC .......... *G03F 7/70825* (2013.01); *F16F 15/03* (2013.01); *G02B 7/1828* (2013.01);
(Continued)

(58) Field of Classification Search
CPC .... G02B 26/0816; G02B 7/1815; G02B 5/09; G02B 7/1822; G02B 7/1828;
(Continued)

(56) References Cited

U.S. PATENT DOCUMENTS 7,802,891 B2    9/2010    Seifert et al.
10,095,126 B2    10/2018    Prochnau et al.
(Continued)

FOREIGN PATENT DOCUMENTS

CN    1828427 A    9/2006
CN    201097108 Y    8/2008
(Continued)

OTHER PUBLICATIONS

International Preliminary Report on Patentability for corresponding PCT Appl No. PCT/EP2017/070056, dated Feb. 21, 2019.
(Continued)

*Primary Examiner* — Mesfin T Asfaw
(74) *Attorney, Agent, or Firm* — Fish & Richardson P.C.

(57) ABSTRACT

The disclosure relates to an optical module with first and second components, a supporting structure and an anticollision device. The first component is supported by the supporting structure and is arranged adjacent to and at a distance from the second component to form a gap. The supporting structure defines a path of relative movement, on which the first and second components move in relation to one another under the influence of a disturbance, a collision between collision regions of the first and second components occurring if the anticollision device is inactive. The anticollision device includes a first anticollision unit on the first component, which produces a first field, and a second anticollision unit on the second component, which is assigned to the first anticollision unit and produces a second field.

20 Claims, 4 Drawing Sheets

(51) Int. Cl.
*G02B 7/182* (2021.01)
*F16F 15/03* (2006.01)
*G21K 1/06* (2006.01)
(52) U.S. Cl.
CPC .............. *G03F 7/702* (2013.01); *G03F 7/709* (2013.01); *G03F 7/70075* (2013.01); *G03F 7/70158* (2013.01); *G21K 1/06* (2013.01)
(58) Field of Classification Search
CPC .............. G03F 7/7015; G03F 7/70116; G03F 7/70075; G03F 7/70825; G03F 7/70158; G03F 7/702; G03F 7/709; G21K 1/06; F16F 15/03
See application file for complete search history.

(56) References Cited

U.S. PATENT DOCUMENTS

| | | |
|---|---|---|
| 2002/0136351 A1 | 9/2002 | Singer |
| 2011/0267596 A1* | 11/2011 | Muehlberger ....... G02B 13/143 355/67 |
| 2013/0128252 A1 | 5/2013 | Rassel et al. |
| 2015/0070678 A1* | 3/2015 | Cadee .................... G03F 7/709 355/72 |
| 2015/0311099 A1 | 10/2015 | Zhu et al. |

FOREIGN PATENT DOCUMENTS

| | | |
|---|---|---|
| CN | 103019045 A | 4/2013 |
| CN | 103034073 A | 4/2013 |
| DE | 100 53 587 A1 | 5/2002 |
| DE | 10 2010 003 169 A1 | 2/2011 |
| DE | 10 2011 079 072 A1 | 3/2012 |
| DE | 10 2015 201 249 A1 | 7/2016 |
| EP | 0 916 038 B1 | 8/2003 |
| GB | 1 556 473 A | 11/1979 |
| TW | 201224669 A | 6/2012 |
| WO | WO2007118376 A1 | 10/2007 |

OTHER PUBLICATIONS

Chinese Office Action, with translation therein, corresponding CN Appl No. 201780048828.6, dated Oct. 10, 2020.
International Search Report and Written Opinion for corresponding PCT Appl No. PCT/EP2017/070056, dated Nov. 16, 2017.
Taiwan Office Action and Search Report, with translation therein, corresponding TW Appl No. 106126741, dated Jan. 28, 2021.

* cited by examiner

OPTICAL MODULE WITH AN ANTICOLLISION DEVICE FOR MODULE COMPONENTS

CROSS-REFERENCE TO RELATED APPLICATIONS

The present application is a continuation of, and claims benefit under 35 USC 120 to, international application PCT/EP2017/070056, filed Aug. 8, 2017, which claims benefit under 35 USC 119 of German Application No. 10 2016 214 785.4, filed Aug. 9, 2016. The entire disclosure of these applications are incorporated by reference herein.

FIELD

The present disclosure relates to an optical module, in particular a facet mirror with a number of components, the collision of which during operation is to be prevented by an anticollision device. The disclosure also relates to a corresponding component for such an optical module, to an optical imaging device with such an optical module, to a method for supporting a component of such an optical module and also to a corresponding optical imaging method. The disclosure can be used in conjunction with any desired optical imaging methods. It can be used particularly advantageously in the production or the inspection of microelectronic circuits and the optical components used for this purpose (for example optical masks).

BACKGROUND

Optical modules, in particular facet mirrors, are used in semiconductor lithography at operating wavelengths in the UV range (for example in the range of 193 nm), but also in the so-called extreme UV range (EUV) with operating wavelengths of between 5 nm and 20 nm (typically in the range of 13 nm), for the production of microstructured or nanostructured components.

The optical modules serve in such cases for ensuring that a mask plane or reticle plane is illuminated as homogeneously as possible. The optical modules are also used for obtaining different illumination settings (illumination angle distributions) in the region of the mask plane or reticle plane. The arrangement and the functioning of optical modules of the type in question here, in particular facet mirrors, in a projection exposure apparatus are described for example in DE 100 53 587 A1 and DE 10 2010 003 169 A1, the entire disclosure of which is hereby respectively incorporated by reference.

Such facet mirrors generally include a plurality of facet elements with one or more reflective optical surfaces. The facet elements are supported by a supporting structure and are usually arranged in a number of facet groups. The tilting angle of the individual facet elements or their optical surfaces can be set alone or in groups by a corresponding actuator system of the supporting structure, in order to achieve, in each case, desired intensity distributions across the illumination light beam or different illumination settings, respectively. The supporting structure supporting the respective facet element in this case prescribes the path of movement of the individual facet element.

In the case of the facet mirrors described above, as also in the case of other known facet mirrors with individually supported facet elements, the fundamental problem exists that, on the one hand, the supporting structure is in fact generally designed to be sufficiently stiff to keep the respective facet element in its respective position and/or orientation during normal undisturbed operation (without the effect of unusual internal or external mechanical disturbances, such as for example shocks or vibrations) and avoid collisions with adjacent facet elements or adjacent components of the imaging device (for example adjacent components of the supporting structure).

However, if there are unusual mechanical disturbances, or the energy of such disturbances exceeds certain limit values, undesired collisions between the respective facet element and adjacent components, for example further facet elements or components of the supporting structure, can occur. This can cause, in particular, undesired damage to the optical surfaces, deformation of the facet elements or the like.

It would in fact be possible in principle to design the supporting structure of the individual facet elements to be even stiffer in order to avoid such collisions. But there are limits to this, not least because of the desired properties typically imposed on the adjustability of the facet elements (in particular the dynamics of the adjusting movement) and the overall space available.

It is known in principle from GB 1 556 473 A to use magnetic fields for contactlessly positioning an optical element in the form of a mirror, or keeping it in a predefined position, consequently therefore preventing a collision of the mirror with the adjacent supporting structure. However, it is problematic here that the magnetic fields used in this case are constantly active, so that, when making adjustments, their force effect on the mirror has to be overcome by the actuators, or the magnetic fields have to be varied in a complex way, respectively. Both lead to increased apparatus-wise expense for the imaging device.

SUMMARY

The disclosure seeks to provide an optical module, an optical component, an optical imaging device, a method for supporting an optical component and also an imaging method that do not have the aforementioned disadvantages, or at least to a lesser extent, and, in particular, to avoid a collision of components of such an optical module that is caused by defined mechanical disturbances, or of reducing the risk of such collisions, in a simple way.

The disclosure is based on the technical teaching that, in the case of an optical module of the type mentioned at the beginning, a collision of components of such an optical module that is caused by defined mechanical disturbances can be avoided, or the risk of such collisions can be reduced, in a simple way by using an anticollision device that acts contactlessly by mutually assigned fields assigned, in the case of which at least one of the fields of the mutually assigned anticollision units is modified by superimposition of partial fields of a plurality of anticollision elements of the anticollision units in such a way that the field line density decreases more sharply with increasing distance from the anticollision unit than the respective field line density of the individual partial fields. The decrease of the field line density is preferably exponential. This achieves the effect that an appreciable counter-force that counteracts the collision is only achieved over a comparatively small range or only when the two components approach each other beyond the maximum approach resulting from normal adjusting movements between the components.

On the other hand, no appreciable counter-force is produced during normal operation, in which there is no disturbance or there are only disturbances of such an energy that cannot lead to the components approaching each other that closely or lead to the components colliding. Accordingly, no appreciable counter-force has to be overcome for eventual normal adjusting movements of the components concerned (in the case of which no critical approach of the two components occurs). Hence, the actuator system used for this can be of a correspondingly simple design.

A further advantage of such a sharply decreasing field line density is that the counter-force preferably increases correspondingly sharply when the components approach one another closely or more closely than the intended normal amount, in order to achieve a timely slowing of the relative movement of the components before the collision, and thereby avoid such a collision.

It goes without saying in this respect that the fields of the anticollision units and the maximum counter-force achievable thereby are designed for a certain predefined energy of the mechanical disturbance to be expected as a maximum. A distinction can be made in this case between different disturbance scenarios. In particular, a distinction can be made between disturbances of different types and/or directions of effect that result in different relative movements of the two components. If it is expected that there will be such different disturbances which produce different relative movements of the two components and which can result, in particular, in collisions at different locations, a number of pairs of anticollision units may eventually be provided.

These pairs of anticollision units may in principle be identically constructed, possibly only differing with regard to the counter-force produced, or being adapted to the respective disturbance scenario, respectively.

According to one aspect, the disclosure therefore relates to an optical module, in particular a facet mirror, with a first component, a second component, a supporting structure, and an anticollision device. The first component is supported by the supporting structure and is arranged adjacent to the second component. Furthermore, the first component is arranged at a distance from the second component to form a gap. The supporting structure defines a path of relative movement of the first component, on which the first component moves along a direction of approach in relation to the second component under the influence of a defined mechanical disturbance, in particular a shock, wherein a collision between a first collision region of the first component and a second collision region of the second component occurs if the anticollision device is absent or inactive. The anticollision device includes a first anticollision unit, which is arranged on the first component and produces a first field. Furthermore, the anticollision device includes a second anticollision unit, which is arranged on the second component, is assigned to the first anticollision unit and produces a second field. The first anticollision unit and the second anticollision unit are designed in such a way that, as the first component and the second component increasingly approach each other along the path of relative movement, the first field and the second field produce an increasing counter-force on the first component that counteracts the approach. The first anticollision unit and/or the second anticollision unit includes a plurality of anticollision elements producing partial fields, the anticollision elements being assigned to one another in such a way that the superimposition of their partial fields produces a field of the anticollision unit with a field line density that decreases more sharply with increasing distance from the anticollision unit along the path of relative movement than a field line density of one of the partial fields.

In other words, the concentration of the field lines described above is achieved in the vicinity of the anticollision unit, and consequently therefore the described sharp decrease of the field line density or sharper decrease in comparison with the partial fields with increasing distance from the anticollision unit is achieved by the superimposition of the partial fields.

The decrease of the field line density resulting from the superimposition of the partial fields of the anticollision elements can in principle be chosen to be as sharp as desired in order to achieve the above-described effects of a late start of an appreciable counter-force effect and least-possible or negligible hindrance of normal adjusting movements, respectively. With preference, the anticollision elements of at least one of the anticollision units are therefore assigned to one another in such a way that the superimposition of partial fields produces a field of the anticollision unit with a field line density that varies in dependence on a distance from the anticollision unit along the path of relative movement. In this case, the field line density preferably decreases exponentially with the distance from the anticollision unit. In addition or as an alternative, it may be provided that the field line density decreases with the distance from the anticollision unit by a power of 5 to a power of 21, preferably a power of 7 to a power of 21, more preferably by a power of 9 to a power of 21.

In the case of certain variants, the superimposed partial fields of the anticollision unit produce an real field which, in interaction with a predefined counter-field, produces a predefined counter-force on the first component only at a distance between the first collision region and the second collision region which si smaller than in a theoretical reference state, for which the theoretical partial forces that are obtained in the direction of approach from the respective partial field without the superimposition of the partial fields are added together.

For the reference state, a theoretical situation is assumed for each anticollision element of the anticollision unit concerned, in which the other anticollision elements of the anticollision unit are absent (consequently therefore no superimposition with their partial fields takes place). For this theoretical situation, the theoretical partial counter-force is then determined from the partial field in dependence on the distance between the components. Subsequently, the theoretical counter-force is calculated by adding the respective amount of the partial counter-forces of all the anticollision elements.

It goes without saying that such superimposition of the partial fields of anticollision elements may in principle also be provided only for one of the two anticollision units of such a pair of mutually assigned anticollision units. With preference, such a superimposition of partial fields of a number of anticollision elements is provided for both anticollision units of such a pair, since the short-rangedness of both fields can be achieved thereby and it can in this way be ensured that an appreciable counter-force effect only occurs when the two components approach each other closely, while normal adjusting movements between the two are not hindered by such a counter-force effect.

The number of anticollision elements of the respective anticollision unit may in principle be chosen as desired, wherein it is adapted to the desired properties of the respective application, in particular to the decrease of the field line density that is to be achieved. In this case, the degree of the decrease of the field line density generally increases with the number of anticollision elements.

In the case of certain variants of the disclosure, the first anticollision unit includes N first anticollision elements, while the second anticollision unit includes M second anticollision elements. Here, the two anticollision units of the pairing may have different numbers of anticollision elements. A particularly simple match is obtained, however, if the anticollision units of a pairing have the same number of anticollision elements, consequently therefore N is equal to M.

Particularly advantageous setups with regard to the superimposition of the partial fields and the resultant counter-force effect are obtained if N and/or M is an even number, since a particularly uniform or advantageous field line distribution can be achieved thereby. The respective partial fields of the anticollision elements can in principle have any desired, possibly different strength and/or field line distribution. In the case of variants of a particularly simple design, the respective partial fields of the anticollision elements have a substantially identical strength and/or field line distribution.

It may also be provided that an asymmetric field line distribution of the real fields is achieved by the number of anticollision elements and/or their respective partial field strength and/or the field line distribution of the respective partial field, in order to achieve a counter-force effect that is adapted to the approaching movement between the components. This may be of advantage in particular if the approach does not take place on a linear path of relative movement.

In principle, any desired number of anticollision elements may be used for the respective anticollision unit. Particularly advantageous setups with a counter-force effect that starts sufficiently late but in time before a collision are obtained if N equals 2 to 20, preferably N equals 4 to 16, more preferably N equals 4 to 12. The same applies if, in addition or as an alternative, M equals 2 to 20, preferably M equals 4 to 16, more preferably M equals 4 to 12.

It should be noted here that, depending on their arrangement, the field line density in the case of N (or M, respectively) anticollision elements generally decreases with the distance from the anticollision unit approximately by a power of N+1 (or by a power of M+1, respectively). Because of the advantageously sharp decrease of the field line density, typically higher numbers of anticollision elements are preferred, as long as it is compatible with the geometrical boundary conditions and the tolerances that are to be maintained.

In order to achieve the above-described sharp decrease of the field line density of the respective field (with increasing distance from the respective anticollision unit), consequently the desired concentration of the field lines in the vicinity of the anticollision unit, the anticollision elements may in principle be arranged in any desired suitable way, in particular the partial fields of the individual anticollision elements may in principle be aligned in any desired suitable way. In this case, the anticollision elements of at least one of the anticollision units define, in their interior, an inner field direction of the partial field with an inner polarity.

Particularly advantageous setups, in particular, particularly advantageous field line distributions, can be achieved if the anticollision elements of the at least one anticollision unit are arranged in a substantially annular arrangement in a plane extending transversely, in particular perpendicularly, to the counter-force. Similar applies if the anticollision elements of the at least one anticollision unit are arranged in a substantially annular arrangement in a plane perpendicular to the inner field direction of one of the anticollision elements.

In this case, it is of advantage if at least two anticollision elements of the at least one anticollision unit are arranged along a circumferential direction of the annular arrangement in such a way that they have substantially opposed inner polarities. In particular, one or more groups of anticollision elements with a first polarity and one or more groups with an opposed second polarity may be provided along the circumferential direction. In this case, each of these groups may include one or more anticollision elements. In particular, the above-described setups with an asymmetric field distribution can be achieved thereby.

In the case of further variants of the disclosure, the anticollision elements of the at least one anticollision unit, at least section-wise along a circumferential direction of the annular arrangement, are arranged with alternating polarity of the inner field direction. By this approach, it is possible to achieve the uniform field distribution as described above in a particularly simple way.

The alignment of the inner field directions may in principle be chosen as desired here. In particular, the alignment of the inner field directions may be adapted to the desired field distribution. In the case of certain variants, the inner field directions of at least two anticollision elements, in particular all the anticollision elements, of the at least one anticollision unit are substantially parallel. As a result, it may be possible for a uniform field distribution to be achieved in a particularly simple way.

In the case of certain variants, it is provided that, in a state of rest without any influence of the mechanical disturbance, the first collision region and the second collision region are at an at-rest distance along the direction of approach, in the case of which the first anticollision unit and the second anticollision unit produce a negligible first counter-force on the first component. Furthermore, for the first collision region and the second collision region, a minimum distance along the direction of approach is predefined, below which, under the effect of the mechanical disturbance, the approach must not go and at which the first anticollision unit and the second anticollision unit produce a second counter-force on the first component. For the first collision region and the second collision region there is then an intermediate distance along the direction of approach, which is achieved under the effect of the mechanical disturbance, which lies between the at-rest distance and the minimum distance, and at which the first anticollision unit and the second anticollision unit produce a third counter-force on the first component that is not negligible and has a magnitude between the first counter-force and the second counter-force.

In the case of certain advantageous variants, the minimum distance is 3% to 20%, preferably 4% to 10%, more preferably 4% to 6%, of the at-rest distance. In addition or as an alternative, the intermediate distance may be 20% to 70%, preferably 30% to 50%, more preferably 30% to 40%, of the at-rest distance. Particularly advantageous configurations in which a sufficiently late but timely start of an appreciable counter-force effect is achieved can be realized in this way.

The at-rest distance, the minimum distance and the intermediate distance may, in principle, be chosen as desired to correspond to the desired properties of the respective imaging device. In the case of certain variants, the at-rest distance is 0.2 mm to 1.0 mm, preferably 0.3 mm to 0.8 mm, more preferably 0.4 mm to 0.6 mm. In addition or as an alternative, the minimum distance may be 0.015 mm to 0.1 mm, preferably 0.02 mm to 0.08 mm, more preferably 0.02 mm to 0.04 mm. In addition or as an alternative, the intermediate distance may be 0.2 mm to 0.02 mm, preferably 0.15 mm to 0.04 mm, more preferably 0.1 mm to 0.06 mm. With these values, particularly advantageous designs can be achieved, in particular for applications in microlithography.

The value of the respective counter-force may in principle be chosen as desired and be adapted to the respective application. In the case of certain advantageous variants with a late start of the counter-force effect, the first counter-force is less than 3% to 20%, preferably less than 4% to 10%, more preferably less than 4% to 6%, of the second counter-force. In addition or as an alternative, the third counter-force may be less than 20% to 70%, preferably less than 30% to 50%, more preferably less than 30% to 40%, of the second counter-force, consequently therefore a sufficiently late start of the counter-force effect can be achieved. For the same reason, in addition or as an alternative, finally the third counter-force may be 350% to 750%, preferably 500% to 750%, more preferably 650% to 750%, of the first counter-force.

A timely start of a sufficient counter-force effect can be achieved in principle in any desired way in dependence on the respective application, in particular the mass inertia of the moved components. In the case of certain variants, the path of relative movement defines at every point a distance between the first collision region and the second collision region along the direction of approach, wherein a minimum distance of the first collision region and the second collision region in the direction of approach, below which the approach must not go under the effect of the mechanical disturbance, is predefined for the first component and the second component. The first anticollision unit and the second anticollision unit are designed here in such a way that the counter-force produced by them on the first component, which counteracts the approach caused by the mechanical disturbance, has reduced a relative speed between the first collision region and the second collision region along the direction of approach to a value of zero at the latest when the minimum distance is reached. A timely slowing of the relative movement between the two components can be achieved thereby.

The arrangement of the respective anticollision unit on the respective component may in principle be realized in any desired suitable way, as long as it is ensured that the counter-force effect achieved with them starts in time to prevent a collision in the event of the respective maximum disturbance to be expected. It is not necessarily required that the anticollision units are arranged in the vicinity of the collision regions of the two components. Rather, they may in principle be provided at a distance as great as desired from these collision regions, as long as a collision is reliably prevented by their force effect in the event of the maximum disturbance to be expected.

In the case of certain variants, the first anticollision unit is arranged in the region of the first collision region, in particular directly in the first collision region, of the first component. In addition or as an alternative, the second anticollision unit may be arranged in the region of the second collision region, in particular directly in the second collision region, of the second component. Both variants allow a particularly simple design of the anticollision units.

As already mentioned at the beginning, in principle a single pairing of two anticollision units may suffice to avoid a collision between the components in all cases of disturbance to be expected. Depending on the type of disturbance to be expected, or the path of relative movement predefined by the supporting device, it may however be desirable to provide a number of such pairings of anticollision units.

In the case of certain variants, the anticollision device therefore includes a third anticollision unit, which is at a distance from the first anticollision unit, is arranged on the first component and produces a third field. Furthermore, the anticollision device includes a fourth anticollision unit, which is at a distance from the second anticollision unit, is arranged on the second component, is assigned to the third anticollision unit and produces a fourth field. If the anticollision device is absent or inactive, a collision between a third collision region of the first component and a fourth collision region of the second component occurs here under the influence of the mechanical disturbance and/or a further mechanical disturbance. The third anticollision unit and the fourth anticollision unit are in turn designed in such a way that, with an increasing approach of the third collision region and the fourth collision region along the path of relative movement or along a further path of relative movement, the third field and the fourth field produce a further counter-force on the first component that increases and counteracts the approach.

It goes without saying that the pairing including the third and fourth anticollision units can in principle be designed and arranged in the same way as described above for the pairing including the first and second anticollision units. In particular, here too, the measures described above can be used to achieve a sufficiently late but timely start of the counter-force effect that prevents a collision of the third and fourth collision regions in case of the maximum disturbance to be expected. To this extent, initially, reference is expressly made in this respect to the statements made above.

In the case of certain variants, it is therefore provided in turn that the third anticollision unit and/or the fourth anticollision unit includes a plurality of further anticollision elements producing further partial fields. Here too, the further anticollision elements are assigned to one another in such a way that the superimposition of the further partial fields produce a further field of the anticollision unit with a field line density that decreases more sharply with increasing distance from the anticollision unit along the path of relative movement than a field line density of one of the further partial fields. In other words, here too, the concentration of the field lines described above in the vicinity of the respective anticollision unit, or the previously described sharp decrease of the field line density with increasing distance from the respective anticollision unit, is advantageously achieved, respectively.

Here too, it is preferably provided, in turn, that the third anticollision unit is arranged in the region of the third collision region, in particular directly in the third collision region, of the first component, while the fourth anticollision unit is preferably arranged in the region of the fourth collision region, in particular directly in the fourth collision region, of the second component.

As already mentioned above, it may suffice that a design is created which is tailored to a given maximum disturbance to be expected. This may be the case, in particular, whenever all other disturbances to be expected do not lead to a collision. Here, without the counter-force effect of the anticollision units along the path of relative movement, the same maximum disturbance to be expected may lead both to collisions in the region of the first and second collision regions and in the region of the third and fourth collision regions. The collisions may in this case occur simultaneously or sequentially.

In the case of certain variants, however, different disturbances, in particular disturbances of different directions, may also lead to different paths of relative movement. In this case, one of the disturbances may lead to a collision in the region of the first and second collision regions, while the other may lead to a collision in the region of the third and fourth collision regions. In the case of certain variants, the further mechanical disturbance is therefore different at least in its direction of effect from that of the mechanical disturbance and the supporting structure defines the further path of relative movement of the first component, which is different from the path of relative movement and on which the first component moves along a further direction of approach in relation to the second component under the influence of the further mechanical disturbance, in particular a further shock.

In principle, any desired suitable fields may be used to achieve the counter-force effect. Preferably, however, magnetic or electric fields are respectively used, alone or in combination. In the case of certain variants, at least one of the anticollision elements, in particular each of the anticollision elements of at least one of the anticollision units, is therefore designed so as to produce a magnetic partial field and/or an electric partial field. The magnetic or electric field may be produced in any desired suitable way. Thus, for example, a corresponding, possibly actively adjustable field can be produced by a corresponding active device of the respective anticollision element. Particularly variable or adaptive anticollision units can be obtained in this way.

In addition or as an alternative, at least one of the anticollision elements, in particular each of the anticollision elements of at least one of the anticollision units, may include a permanent magnet. Particularly simple and robust configurations can be achieved in this way.

The first component may be any desired component of the optical module. It is preferably an optical component with an optical surface. For example, the first component may be a facet element of a facet mirror. The second component may be a further optical component of the optical module, which has a further optical surface and is possibly supported in the same way as the first component by the supporting structure. For example, this may also be a further facet element of the facet mirror. However, it is similarly also possible that the second component is a different component of the optical module. In particular, it may be a component of the supporting structure that is adjacent to the first component.

It also goes without saying that the anticollision units may be formed in such a way that the counter-force effect is available or can come into effect, respectively, at any desired times during operation but also during transportation of the optical module. In particular, the advantages take effect particularly well when transporting the optical module (alone or for example installed in an illumination device or a projection device, respectively), when there is a higher risk of unintentional disturbances in the form of shocks or the like. But also during operation of the optical module, for example, in an optical imaging device, the advantages of the disclosure can take effect particularly well in the event of disturbances, such as in particular earth tremors.

The present disclosure also relates to a component for an optical module, in particular a facet element, which is formed as the first component or the second component of an optical module according to the disclosure, as described in detail above. To this extent, reference is expressly made to the statements made above with regard to the features and advantages of this component. Accordingly, the component again includes an anticollision unit with a plurality of anticollision elements producing partial fields, which are assigned to one another in such a way that the superimposition of partial fields produce the real field described above. This makes it possible to achieve the variants and advantages described above in the context of the optical module according to the disclosure to the same extent, and so reference is made to the explanations given above in this respect.

The present disclosure also relates to an optical imaging device, in particular for microlithography, including an illumination device with a first optical element group, an object device for receiving an object, a projection device with a second optical element group and an image device, the illumination device being configured for illuminating the object and the projection device being configured for projecting an image of the object onto the image device. The illumination device and/or the projection device includes at least one optical module according to the disclosure. This also makes it possible to achieve the variants and advantages described above in the context of the optical module according to the disclosure to the same extent, and so reference is made to the explanations given above in this respect.

The present disclosure also relates to a method for supporting a first component of an optical module, in particular a facet element of a facet mirror, wherein the first component is supported by a supporting structure and is arranged adjacent to a second component, the first component being arranged at a distance from the second component to form a gap. The supporting structure defines a path of relative movement of the first component, on which the first component moves along a direction of approach in relation to the second component under the influence of a defined mechanical disturbance, in particular a shock, wherein a collision between a first collision region of the first component and a second collision region of the second component occurs if the anticollision device is absent or inactive. A first anticollision unit of an anticollision device is arranged on the first component and produces a first field, while a second anticollision unit of the anticollision device is arranged on the second component, is assigned to the first anticollision unit and produces a second field. As the first component and the second component increasingly approach each other along the path of relative movement, the first field and the second field produce a counter-force on the first component that increases and counteracts the approach. The first anticollision unit and/or the second anticollision unit includes a plurality of anticollision elements producing partial fields, wherein the anticollision elements are assigned to one another in such a way that a superimposition of the partial fields produces a field of the anticollision unit with a field line density that decreases more sharply with increasing distance from the anticollision unit along the path of relative movement than a field line density of one of the partial fields. This also makes it possible to achieve the variants and advantages described above in the context of the optical module according to the disclosure to the same extent, and so reference is made to the explanations given above in this respect.

The present disclosure also relates to an optical imaging method, in particular for microlithography, in which an object is illuminated by way of an illumination device with a first optical element group and an image of the object is produced on an image device via a projection device with a second optical element group. A method according to the disclosure is used for supporting a first component of an optical module in the illumination device and/or the projection device, in particular while producing the image. This also makes it possible to achieve the variants and advantages described above in the context of the optical module according to the disclosure to the same extent, and so reference is made to the explanations given above in this respect.

Further aspects and embodiments of the disclosure become apparent from the dependent claims and the following description of preferred embodiments, which relates to the accompanying figures. All combinations of the disclosed

DETAILED DESCRIPTION OF THE DISCLOSURE

First Embodiment

A preferred embodiment of a projection exposure apparatus 101 according to the disclosure, which includes a preferred embodiment of an optical module according to the disclosure, is described below with reference to FIGS. 1 to 8. To simplify the following explanations, an x, y, z coordinate system is indicated in the drawings, the z direction corresponding to the direction of the gravitational force. It goes without saying that it is possible in further designs to choose any desired other orientations of an x, y, z coordinate system.

Figure 1:
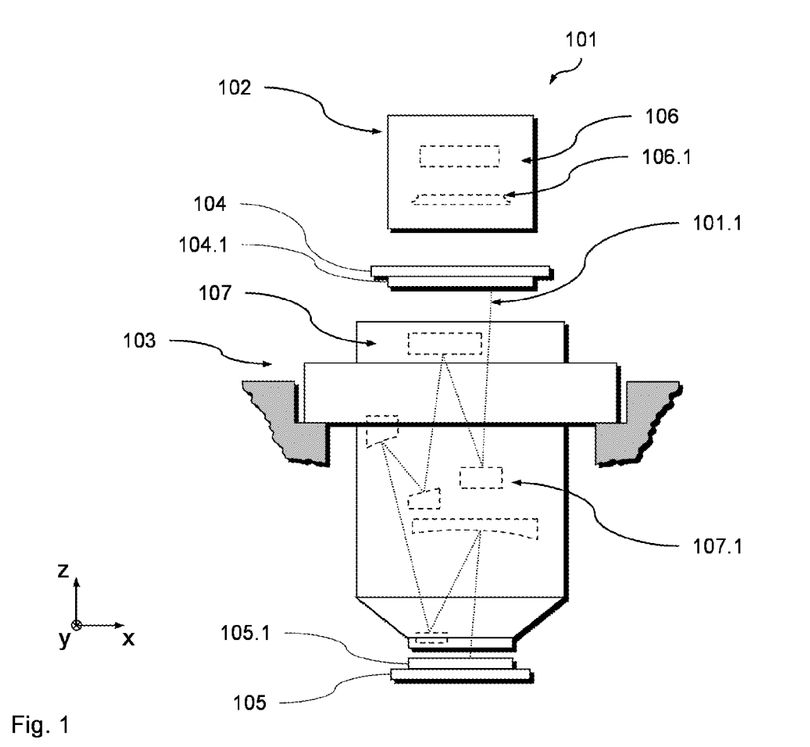
FIG. 1 is a schematic representation of a preferred embodiment of a projection exposure apparatus according to the disclosure, which includes a preferred embodiment of an optical module according to the disclosure and using which preferred embodiments of the methods according to the disclosure may be executed.

FIG. 1 is a schematic, not-to-scale representation of the projection exposure apparatus 101, which is used in a microlithographic process for producing semiconductor components. The projection exposure apparatus 101 includes an illumination device 102 and a projection device 103. The projection device 103 is designed to transfer, in an exposure process, an image of a structure of a mask 104.1, which is arranged in a mask unit 104, onto a substrate 105.1, which is arranged in a substrate unit 105. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical element group 106, which has an optical module 106.1 according to the disclosure. As explained in more detail below, the optical module 106.1 is designed in the form of a field facet mirror. The projection device 103 also includes an optical element group 107, which includes the optical module 107.1. The optical modules 106.1, 107.1 of the optical element groups 106, 107 are arranged along a folded optical axis 101.1 of the projection exposure apparatus 101. Each of the optical element groups 106, 107 may include a multiplicity of optical modules 106.1, 107.1.

In the present embodiment, the projection exposure apparatus 101 operates with light in the EUV range (extreme ultraviolet radiation), with wavelengths of between 5 nm and 20 nm, in particular with a wavelength of 13 nm. The optical modules 106.1, 107.1 of the illumination device 102 and the projection device 103 are therefore exclusively reflective optical elements. In further configurations of the disclosure, it is of course also possible (in particular in dependence on the wavelength of the illumination light) to use any type of optical elements (refractive, reflective, diffractive) alone or in any desired combination. In particular, the illumination device 102 and/or the projection device 103 may include one or more optical modules 106.1 according to the disclosure.

Figure 2:
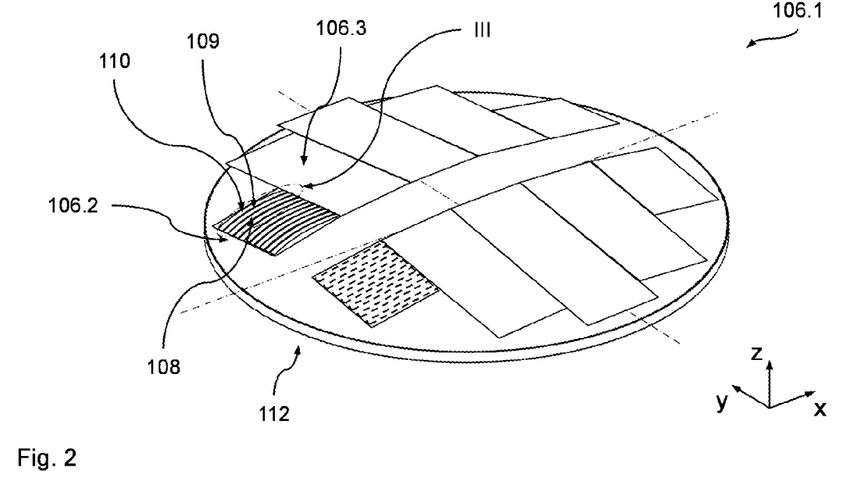
FIG. 2 is a schematic perspective representation of a first embodiment of an optical module according to the disclosure from FIG. 1.

FIG. 2 shows an embodiment of an optical module 106.1 according to the disclosure. The latter is a field facet mirror, which serves, in particular, in interaction with a pupil facet mirror for producing secondary light sources in an illumination beam path, in order to achieve an illumination of the mask 104.1 that is as homogeneous as possible in the regions to be illuminated, and, in particular, to obtain different illumination distributions or illumination settings, respectively. In the present example, the incidence of light on the facet mirror 106.1 represented takes place substantially along the z direction. However, any other desired direction of illumination, inclined in relation to the z direction, may also be provided.

The facet mirror 106.1 according to FIG. 2 includes a plurality of optical elements 108 to 110, which are designed as field facet elements. On their upper side, which during operation is facing the incident light, the facet elements 108 to 110 respectively have in the present example one or more optically effective surfaces in the form of mirror surfaces 111.

In the present example, the facet elements 108 to 110 of the facet mirror 106.1 are arranged in facet groups 106.2. The facet groups 106.2 of the facet mirror 106.1 in this case respectively define reference planes 106.3, which in the present example are arranged at different angles of inclination in relation to the plane of main extension (xy plane) defined by the x and y directions. In FIG. 2, the individual facet elements 108 to 110 are merely represented for one facet group 106.2. The other facet groups 106.2 likewise include facet elements 108 to 110 arranged over the extent of the respective reference planes 106.3. It goes without saying, however, that in the case of other variants of the disclosure any other desired arrangement and/or grouping of the facet elements may also be chosen.

Figure 3:
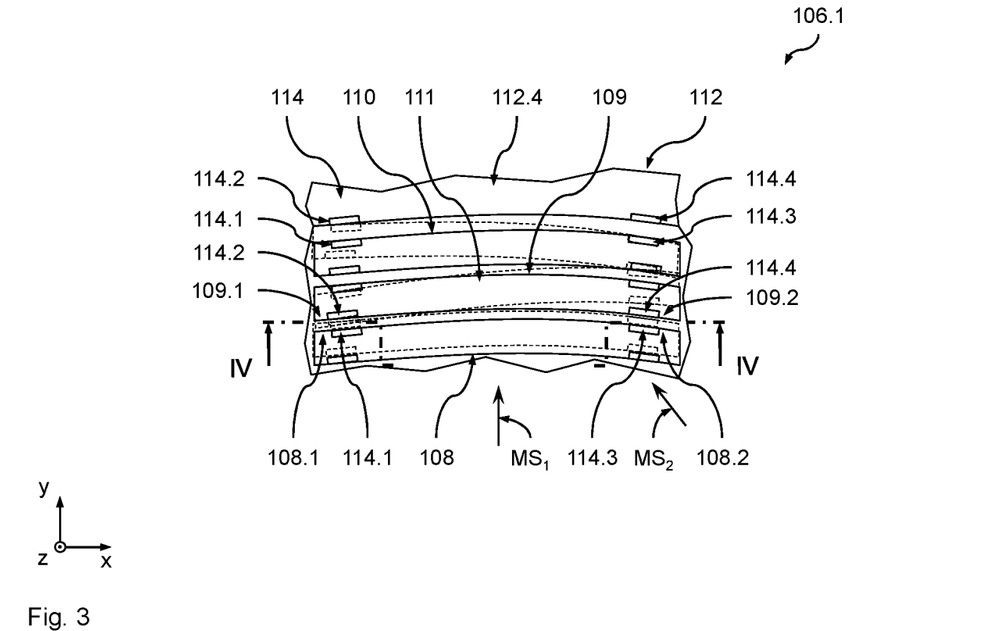
FIG. 3 is a schematic plan view of the detail III of the optical module from FIG. 2.
Figure 4:
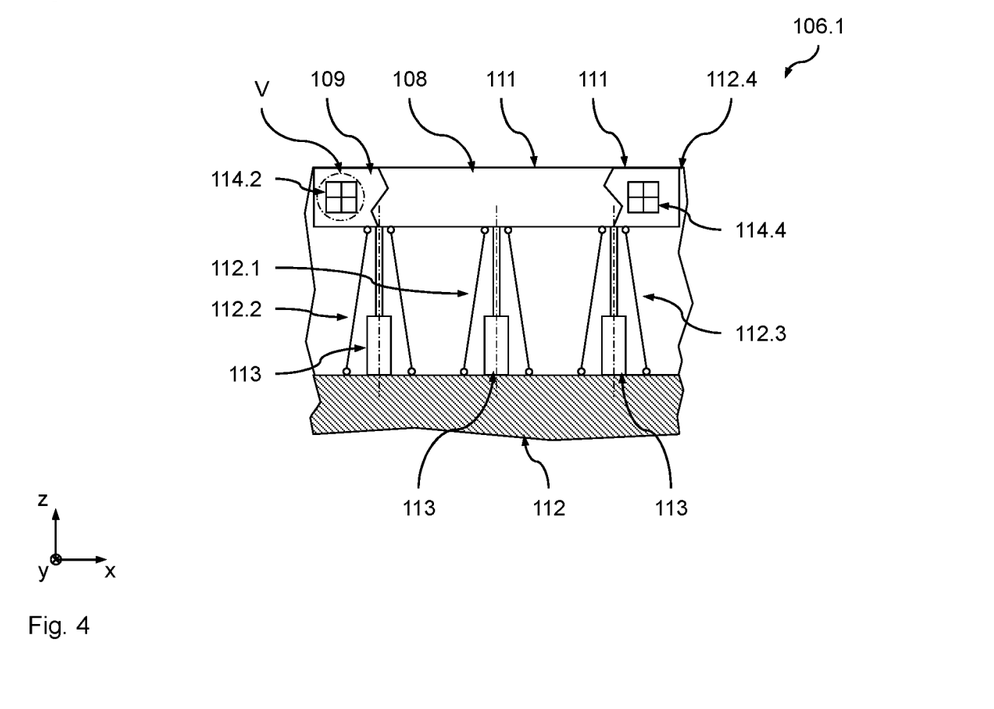
FIG. 4 is a schematic sectional view of the optical module from FIG. 3 (along the line IV-IV).

FIG. 3 shows a schematic plan view of the detail III of the optical module 106.1 from FIG. 3, while FIG. 4 shows a schematic sectional view of the optical module 106.1 along the line IV-IV from FIG. 3.

As can be seen, in particular, from FIGS. 2 to 4, the optical module 106.1 includes as a first component a first facet element 108, as a second component a second facet element 109 and a third facet element 110, which are all supported by a supporting structure 112.

Here, the first facet element 108 is supported by a first supporting unit 112.1 of the supporting structure 112, while the second facet element 109 is supported by a second supporting unit 112.2 of the supporting structure 112. Equally, the third facet element 110 is supported by a third supporting unit 112.3 of the supporting structure 112.

The respective supporting unit 112.1 to 112.3 in this case each includes an actuator unit 113, by which the position and/or orientation of the optical surface 111 of the respective facet element 108 110 can be actively set in one or more (up to all six) degrees of freedom in space. It goes without saying, however, that in the case of other variants such an active setting possibility may also be absent, consequently therefore purely passive support may be provided. Similarly, any desired combination of active and passive support is of course also possible.

The first facet element 108 is in this case arranged adjacent to the second facet element 109, the two being spaced apart from one another in such a way that a gap is formed between them, hence, they do not touch. The same applies to the second facet element 109 and the third facet element 110. The third facet element 110 is finally arranged adjacent to a component 112.4 of the supporting structure 112, the two being spaced apart from one another in such a way that a gap is formed between them, hence, they do not touch.

In each case, the supporting structure 112 defines a path of relative movement $RB_i$ between the facet elements 108 to 110 and the supporting structure 112, respectively, on which they move in relation to one another under the influence of a defined mechanical disturbance $MS_i$, for example, a shock, along a direction of approach $AR_i$. Depending on the magnitude of the disturbance $MS_i$, in each case, a collision may occur between the two components located adjacent to one another.

As described below by way of example on the basis of the facet elements 108 and 109, an anticollision device 114, which counteracts such collisions and avoids such collisions for the disturbances $MS_i$ to be expected during operation or transportation of the components of the projection exposure apparatus 101, respectively, is therefore provided.

Figure 6:
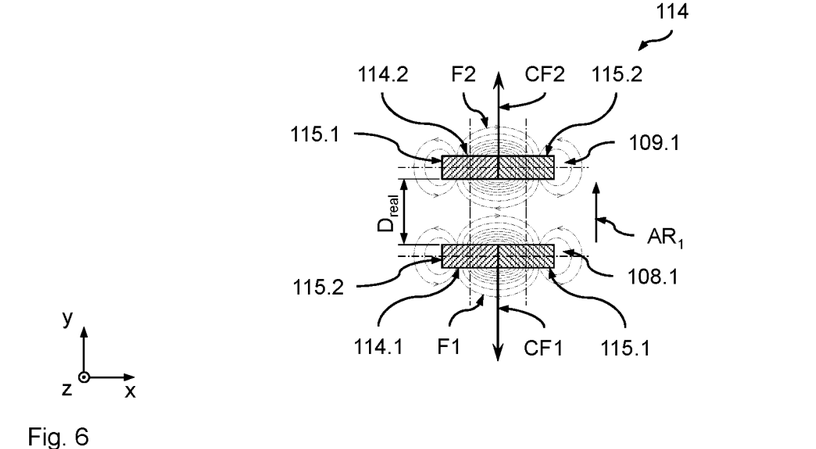
FIG. 6 is a schematic sectional view of the anticollision unit from FIG. 5 (along the line VI-VI) to represent the real field distribution.

As can be seen, in particular, from FIGS. 3 and 6, for example under the influence of a defined first mechanical disturbance $MS_1$ (for example a shock along the y direction), the first facet element 108 and the second facet element 109 approach each other along a path of relative movement $RB_1$ in a direction of approach $AR_1$. If the anticollision device 114 were absent or inactive, there would in this case be a collision between a first collision region 108.1 of the first facet element 108 and a second collision region 109.1 of the second facet element 109, as becomes apparent from the dashed contours in FIG. 3.

In order to avoid such collisions, the anticollision device 114 includes a first anticollision unit 114.1, which is arranged on the first facet element 108 and produces a first field F1, and also a second anticollision unit 114.2, which is arranged on the second facet element 109, is (spatially and functionally) assigned to the first anticollision unit 114.1 and produces a second field F2.

The first anticollision unit 114.1 and the second anticollision unit 114.2 are configured in such a way that, as the first facet element 108 and the second facet element 109 increasingly approach each other along the path of relative movement $RB_1$, the first field F1 and the second field F2 contactlessly produce an increasing counter-force CF1 on the first facet element 108 that counteracts the approach. A corresponding reaction force CF2 is also exerted on the second facet element 109 by the reaction of the fields F1 and F2.

In principle, any desired suitable fields F1 and F2 may be used to achieve the counter-force effect. Preferably, however, magnetic or electric fields are respectively used for this, alone or in any desired combination. In the present example, the anticollision elements 115.1, 115.2 are designed as permanent magnets, which in each case produce a magnetic partial field TF1 and TF2, respectively.

It goes without saying, however, that in the case of other variants the respective partial field TF1 or TF2 may also be produced in any other desired suitable way. Thus, for example, a corresponding, possibly actively adjustable partial field TF1 or TF2 may be produced by a corresponding active device of the respective anticollision element 115.1 or 115.2. Particularly variable or adaptive anticollision units 114.1 to 114.4 can be respectively obtained in this way.

Figure 5:
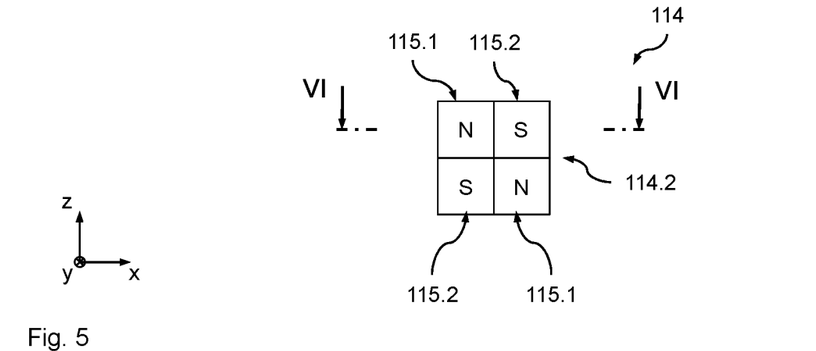
FIG. 5 is a schematic enlarged view of an anticollision unit from FIG. 4 (detail V).

As can be seen in particular from FIGS. 4 to 6, the first anticollision unit 114.1 and the second anticollision unit 114.2 respectively include a plurality of anticollision elements 115.1, 115.2, which in each case produce substantially equally strong partial fields TF1, TF2 with the same field line distribution and the same pattern of the field line density, respectively. In the present example, N=4 anticollision elements 115.1, 115.2, more precisely, two anticollision elements 115.1 and two anticollision elements 115.2, are provided for the first anticollision unit 114.1. The same applies to the second anticollision unit 114.2 with M=4 anticollision elements 115.1, 115.2, more precisely, two anticollision elements 115.1 and two anticollision elements 115.2.

Figure 7:
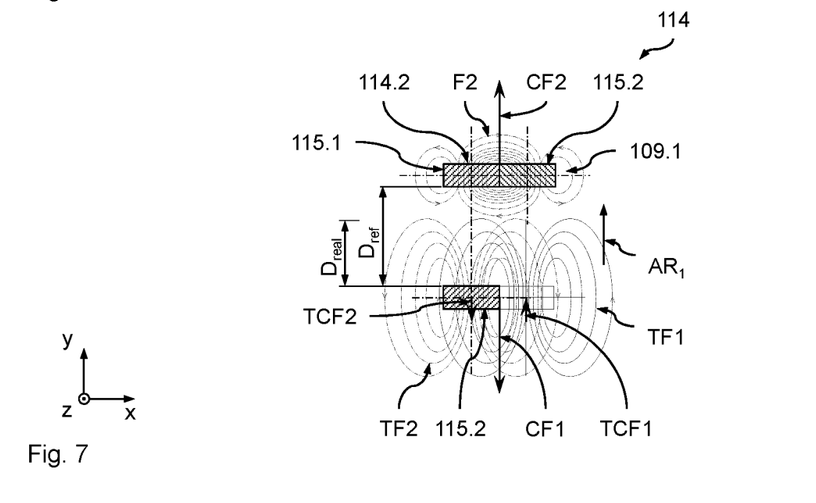
FIG. 7 is a schematic sectional view of the anticollision unit from FIG. 5 (along the line VI-VI) to represent the theoretical reference state.

The anticollision elements 115.1 115.2 are respectively arranged in a so-called quadrupole configuration and in each case produce a partial field TF1 or TF2, respectively (as is represented in FIG. 7). The anticollision elements 115.1, 115.2 are assigned to one another in such a way that the superimposition of their partial fields TF1 and TF2 produces the real field F1 and F2, respectively.

For this purpose, the anticollision elements 115.1, 115.2 in each case, in their interior, define an inner field direction IFR1 or IFR2 of the partial field TF1 and TF2, respectively, with an inner polarity IP1 and IP2, respectively. As can be seen in particular from FIGS. 4, 5 and 8, the anticollision elements 115.1, 115.2 of the anticollision units 114.1 and 114.2 are arranged in a substantially annular arrangement in a plane (here: xy plane) extending perpendicularly to the counter-force CF1 or CF2 and perpendicularly to the inner field direction IFR1 or IFR2, respectively.

Figure 8:
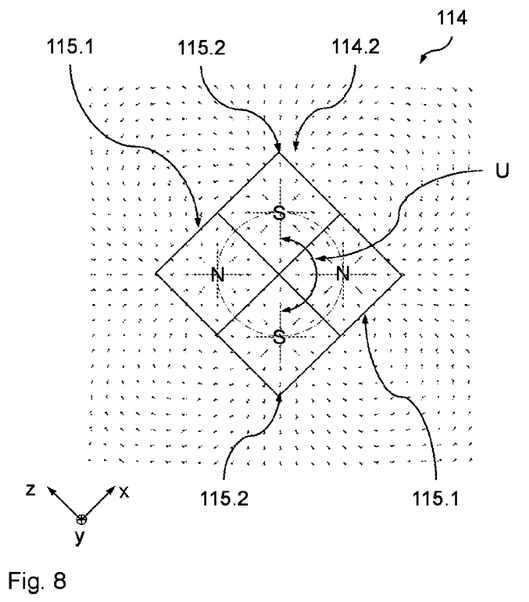
FIG. 8 is a further schematic view of the anticollision unit from FIG. 5 to represent the real pattern of the field lines.

Here, the anticollision elements 115.1, 115.2 of the anticollision units 114.1 to 114.4 are arranged along a circumferential direction U of the annular arrangement in such a way that they alternately have substantially opposed inner polarites IP1, IP2 with substantially parallel inner field directions IFR1, IFR2. Consequently, the anticollision elements 115.1 115.2 are therefore arranged with alternating polarities IP1, IP2 of the inner field directions IFR1, IFR2. In the case of FIGS. 5 and 8, therefore, an anticollision element 115.1 with a magnetic north pole (on the surface facing the anticollision unit 114.1) is respectively followed along the circumferential direction U by an anticollision element 115.2 with a magnetic south pole (on the surface facing the anticollision unit 114.1), and vice versa. Here, FIG. 8 shows the pattern and the direction, respectively, of the field lines at certain points in a plane parallel to the xz plane.

It goes without saying that, in the case of other variants, the alignment of the inner field directions IFR1, IFR2 can in principle be chosen as desired. In particular, the alignment of the inner field directions IFR1, IFR2 may be adapted to the desired field distribution of the fields F1, F2.

Furthermore, one or more groups G1 of anticollision elements 115.1 with the first polarity IP1 and one or more groups G2 of anticollision elements 115.2 with an opposed second polarity IP2 may be provided along the circumferential direction U. In this case, each of these groups G1 or G2 may include one or more anticollision elements 115.1 or 115.2, respectively. Herewith, in particular, the above-described setups with an asymmetric field distribution can be achieved.

As becomes apparent from FIGS. 6 and 7, the assignment of the anticollision elements 115.1, 115.2 is performed in such a way that a predefined counter-force CF1 is produced on the first facet element 108 when there is a distance $D_{real}$ between the first collision region 108.1 and the second collision region 109.1. This distance $D_{real}$ is smaller than a reference distance $D_{ref}$ between the first collision region 108.1 and the second collision region 109.1, in the case of which this predefined counter-force CF1 is achieved for a theoretical reference state (see FIG. 7).

For this theoretical reference state, the amounts of the four theoretical individual partial forces TCF1 and TCF2 along the direction of approach $AR_1$ are added together, which are obtained from the respective partial field TF1 or TF2 of the respective anticollision element 115.1, 115.2 of the first anticollision unit 114.1 (without the respective superimposition of the partial fields of the other anticollision elements 115.1, 115.2 of the anticollision unit 114.1) in interaction with the second anticollision unit 114.2. Consequently, the respective partial force TCF1 or TCF2 is therefore obtained from the interaction between the partial field TF1 or TF2 of the anticollision element 115.1 or 115.2, respectively, of the first anticollision unit 114.1 and the field F2 of the second anticollision unit 114.2.

In other words, for the reference state, a theoretical situation is assumed for each anticollision element 115.1 or 115.2 of the anticollision unit 114.1 or 114.2, respectively, in which the other anticollision elements 115.1 or 115.2 of the anticollision unit 114.1 or 114.2, concerned are absent (consequently therefore no superimposition of their partial fields TF1 or TF2 takes place). For this theoretical situation, the theoretical partial counter-force TCF1 or TCF2 is then determined from the partial field TF1 or TF2 in dependence on the distance D between the components. Subsequently, the theoretical counter-force is calculated by adding the respective amounts of the theoretical partial counter-forces TCF1, TCF2 of all the anticollision elements 115.1, 115.2 of the anticollision unit 114.1 or 114.2 concerned in the direction of approach.

As can be seen, in particular, from FIG. 6, in other words, by the superimposition of the partial fields TF1 and TF2, a concentration of the field lines of the fields F1 or F2 is achieved in the vicinity of the anticollision unit 114.1 or 114.2. This therefore brings about the above-described decrease of the field line density with increasing distance from the anticollision unit 114.1 or 114.2 that is sharper than the decrease of the field line density of the individual partial fields TF1 and TF2.

With the anticollision device 114, the fields F1 and F2 of the anticollision units 114.1 and 114.2 assigned to one another are consequently therefore modified by the superimposition of partial fields TF1, TF2 of the anticollision elements 115.1, 115.2 in such a way that the field line density decreases sharply with increasing distance from the anticollision unit 114.1 and 114.2, respectively, along the direction of approach $AR_1$. In the present example, in particular, an advantageous exponential decrease of the field line density is achieved.

By this approach, the effect is achieved that an appreciable counter-force CF1 or CF2 that counteracts the collision is only achieved over a comparatively small range and only when the two facet elements 108 and 109 reach an approach (i.e. a distance) $D_{lim}$ towards each other along the direction of approach $AR_1$ which is closer (i.e. of a smaller amount) than the maximum approach (i.e. the distance) $D_{stell,max}$ which results from normal (i.e. intended during normal operation) adjusting movements between the facet elements 108 and 109 (i.e., it holds: $D_{stell,\ max}>D_{lim}$).

On the other hand, no appreciable counter-force CF1 or CF2 is produced during normal operation, in which there is no disturbance $MS_i$ or in which there are only disturbances $MS_i$ of such an energy that cannot lead to the components approaching each other that closely or the facet elements 108 and 109 colliding. Accordingly, no appreciable counter-force CF1 or CF2 has to be overcome for normal adjusting movements that may be desired at the facet elements 108 and 109 (in the case of which no critical approach of the two facet elements 108 and 109 occurs). Hence, the actuator system 113 provided for this purpose can be of a correspondingly simple design.

A further advantage of the exponentially decreasing field line density of the fields F1 and F2 is that the counter-force CF1 or CF2 increases correspondingly sharply when the facet elements 108 and 109 approach one another closely or more closely than the intended normal amount, in order to achieve a timely slowing of the relative movement of the facet elements 108 and 109 before the collision, and thereby prevent such a collision.

It also goes without saying that the fields F1 and F2 of the anticollision units 114.1 and 114.2 and the maximum counter-force CF1 or CF2 achievable thereby are configured for a certain predefined energy $EMS_i$ of the mechanical disturbance $MS_i$ to be expected as a maximum. A distinction can be made here between different disturbance scenarios. In particular, a distinction can be made between disturbances $MS_i$ of different types and/or directions of effect that result in different relative movements of the two facet elements 108 and 109.

In the present example, such different disturbances $MS_i$ which produce different relative movements of the two facet elements 108 and 109 and which can result in collisions at different locations can be expected. Accordingly, along with the pair of anticollision units 114.1 and 114.2, a further pair of anticollision units 114.3 and 114.4 is provided for the facet elements 108 and 109. The anticollision units 114.3 and 114.4 are in this case provided at the other end (in the x direction) of the facet elements 108 and 109 and are, in principle, designed identically to the anticollision units 114.1 and 114.2.

In the present example, the superimposition of the partial fields TF1, TF2 of the anticollision elements is provided for both anticollision units 114.1, 114.2 and 114.3, 114.4, respectively, of the respective pair, since the desired short-rangedness of the two fields F1 and F2 can be achieved thereby and, by this approach, it can be ensured that an appreciable counter-force effect CF1 or CF2 only occurs when the two facet elements 108 and 109 approach each other highly closely, while normal adjusting movements between the two facet elements 108 and 109 are not hindered by such a counter-force effect.

It goes without saying, however, that the described superimposition of the partial fields TF1, TF2 of the anticollision elements 115.1, 115.2 may in principle also be provided only for one of the two anticollision units 114.1 or 114.2 and 114.3 or 114.4, respectively, of such pairs of anticollision units 114.1, 114.2 and 114.3, 114.4, respectively, that are assigned to one another.

The decrease of the field line density resulting from the superimposition of the partial fields TF1, TF2 of the anticollision elements 115.1, 115.2 can in principle be chosen to be as sharp as desired in order to achieve the above-described effects of a late start of an appreciable counter-force effect CF1, CF2, and least-possible or negligible hindrance of normal adjusting movements, respectively. In the present example, the anticollision elements 115.1, 115.2 of the two anticollision units 114.1, 114.2 and 114.3, 114.4 are assigned to one another in such a way that the superimposition of the partial fields TF1, TF2 produces a field F1 or F2 with a field line density that, in dependence on a distance from the anticollision unit 114.1, 114.2 or 114.3, 114.4, respectively, along the path of relative movement $R_i$ in the direction of approach $AR_i$, decreases exponentially with the distance from the anticollision unit 114.1, 114.2 and 114.3, 114.4, respectively. To be more precise, the four anticollision elements 115.1, 115.2 of each of the two anticollision units 114.1, 114.2 and 114.3, 114.4, respectively, are arranged in a so-called quadrupole configuration, in which the field line density of the fields F1 or F2 decreases along the direction of approach $AR_i$ with the distance from the anticollision unit 114.1, 114.2, 114.3, 114.4 approximately by a power of 5.

It goes without saying, however, that in the case of other variants of the disclosure a different decrease of the field line density of the fields F1 or F2 may also be obtained. Thus, the field line density may decrease with the distance from the anticollision unit 114.1, 114.2, 114.3, 114.4 by a power of 5 to a power of 21, preferably a power of 7 to a power of 21, more preferably by a power of 9 to a power of 21.

It goes without saying that the number N or M, respectively, of anticollision elements 115.1, 115.2 of the respective anticollision unit 114.1, 114.2, 114.3, 114.4 may in principle be chosen as desired, wherein in it is adapted to the desired properties of the respective application, in particular to the decrease of the field line density that is to be achieved. In this case, the degree of the decrease of the field line density generally increases with the number of anticollision elements 115.1, 115.2.

With some variants, both anticollision units 114.1, 114.2 and 114.3, 114.4, respectively, of the respective pairing may have different numbers of anticollision elements (i.e. it holds: N is not equal to M). Thus, an asymmetric field distribution of the fields F1, F2 can be achieved by the number of anticollision elements 115.1, 115.2 and/or their respective partial field strength TF1, TF2, in order to achieve a counter-force effect CF1, CF2 that is adapted to the approaching movement between the facet elements 108 and 109. This may be of advantage, in particular, if the approach does not take place on a linear path of relative movement $R_j$.

In principle, any desired number of anticollision elements 115.1, 115.2 may be used for the respective anticollision unit 114.1, 114.2, 114.3, 114.4. Particularly advantageous setups with a counter-force effect that starts sufficiently late but in time before a collision are obtained if N equals 2 to 20, preferably N equals 4 to 16, more preferably N equals 4 to 12. The same applies if, in addition or as an alternative, M equals 2 to 20, preferably M equals 4 to 16, more preferably M equals 4 to 12.

In the present example, in a state of rest without any influence of the mechanical disturbance $MS_1$, the first collision region 108.1 and the second collision region 109.1 are at an at-rest distance $D_{Ruhe}$ along the direction of approach $AR_1$, in the case of which the first anticollision unit 114.1 and the second anticollision unit 114.2 produce a negligible first counter-force $CF_1$ on the first facet element 108. For the first collision region 108.1 and the second collision region 109.1 there is also predefined a minimum distance $D_{min}$ along the direction of approach $AR_1$, below which the approach must not go under the effect of the mechanical disturbance $MS_1$ and at which the first anticollision unit 114.1 and the second anticollision unit 114.2 produce a second counter-force $CF1_2$ on the first facet element 108. For the first collision region 108.1 and the second collision region 109.1 there is also predefined an intermediate distance $D_{zwi}$ along the direction of approach $AR_1$ which is achieved under the effect of the mechanical disturbance $MS_1$, lies between the at-rest distance $D_{Ruhe}$ and the minimum distance $D_{min}$ and at which the first anticollision unit 114.1 and the second anticollision unit 114.2 produce a third counter-force $CF1_3$ on the first facet element 108 that is not negligible and lies between the first counter-force $CF1_1$ and the second counter-force $CF1_2$.

In the present example, the minimum distance $D_{min}$ is approximately 5% of the at-rest distance $D_{Ruhe}$. In the case of advantageous variants, the minimum distance $D_{min}$ is 3% to 20%, preferably 4% to 10%, more preferably 4% to 6%, of the at-rest distance $D_{Ruhe}$.

In the present example, the intermediate distance $D_{zwi}$ is approximately 30% of the at-rest distance $D_{Ruhe}$. In the case of advantageous variants, the intermediate distance $D_{zwi}$ is 20% to 70%, preferably 30% to 50%, more preferably 30% to 40%, of the at-rest distance $D_{Ruhe}$. Particularly advantageous configurations in which a sufficiently late but timely start of an appreciable counter-force effect CF1 is achieved can be achieved in this way.

The at-rest distance $D_{Ruhe}$, the minimum distance $D_{zwi}$ and the intermediate distance $D_{zwi}$ may, in principle, be chosen as desired to correspond to the desired properties of the respective imaging device 101. With certain variants, the at-rest distance $D_{Ruhe}$, is 0.2 mm to 1.0 mm, preferably 0.3 mm to 0.8 mm, more preferably 0.4 mm to 0.6 mm. In addition or as an alternative, the minimum distance $D_{min}$ may be 0.015 mm to 0.1 mm, preferably 0.02 mm to 0.08 mm, more preferably 0.02 mm to 0.04 mm. In addition or as an alternative, the intermediate distance $D_{zwi}$ may be 0.2 mm to 0.02 mm, preferably 0.15 mm to 0.04 mm, more preferably 0.1 mm to 0.06 mm. With these values, particularly advantageous designs can be achieved, in particular for applications in microlithography.

The value of the respective counter-force CF1 may in principle be chosen as desired and be adapted to the respective application. In the case of certain advantageous variants with a late start of the counter-force effect CF1, the first counter-force $CF1_1$ is less than 3% to 20%, preferably less than 4% to 10%, more preferably less than 4% to 6%, of the second counter-force $CF1_2$. In addition or as an alternative, the third counter-force $CF1_3$ may be less than 20% to 70%, preferably less than 30% to 50%, more preferably less than 30% to 40%, of the second counter-force $CF1_2$, consequently therefore a sufficiently late start of the counter-force effect CF1 can be achieved. For the same reason, in addition or as an alternative, finally the third counter-force $CF1_3$ may be 350% to 750%, preferably 500% to 750%, more preferably 650% to 750%, of the first counter-force $CF1_1$.

The timely start of a sufficient counter-force effect CF1 is achieved in the present example in dependence on the respective application, in particular, dependent on the mass inertia of the moved facet elements 108 to 110. The first anticollision unit 114.1 and the second anticollision unit 114.2 are formed, here, in such a way that the counter-force CF1 produced by them on the first facet element 108 has reduced a relative speed (caused by the mechanical disturbance $MS_1$) between the first collision region 108.1 and the second collision region 109.1 along the direction of approach $AR_1$ to a value of zero at the latest when the minimum distance $D_{min}$ is reached. A timely slowing of the relative movement between the two facet elements 108 and 109 can be achieved thereby.

The arrangement of the respective anticollision unit 114.1 to 114.4 on the respective facet element 108 to 110 may, in principle, be chosen in any desired suitable way, as long as it is ensured that the counter-force effect CF1, CF2 achieved with them starts in time to prevent a collision in the event of the maximum disturbance $MS_i$ to be expected. It is not absolutely necessary here that the anticollision units 114.1 to 114.4 are arranged in the vicinity of the collision regions 108.1, 109.1 of the two facet elements 108 and 109. Rather, they may in principle be provided at a distance as great as desired from these collision regions 108.1, 109.1, as long as a collision is reliably prevented by their force effect CF1, CF2 in the event of the maximum disturbance $MS_i$ to be expected.

In the present example, the first anticollision unit 114.1 is however arranged directly in the first collision region 108.1. In addition, the second anticollision unit 114.2 is arranged directly in the second collision region 109.2. Both variants allow a particularly simple design of the anticollision units 114.1, 114.2.

As already mentioned at the beginning, in principle, a single pairing of two anticollision units 114.1, 114.2 may suffice to avoid a collision between the facet elements 108, 109 in all cases of disturbance $MS_i$ to be expected. Depending on the type of disturbance $MS_i$ to be expected or the path of relative movement $R_i$ predefined by the supporting device 112, respectively, it may however be desirable, as in the present example, to provide a number of such pairings of anticollision units 114.1, 114.2 and 114.3, 114.4, respectively, spaced apart from one another.

The third anticollision unit 114.3 and the fourth anticollision unit 114.4 are again designed in such a way that, with an increasing approach of the third collision region 108.2 and the fourth collision region 109.2 along the path of relative movement $R_1$ or along a further path $R_2$ of relative movement, the third field F3 of the third anticollision unit 114.3 and the fourth field F4 of the fourth anticollision unit 114.4 produce an increasing further counter-force CF3 on the first facet element 108 that counteracts the approach.

In the present example, the pairing including the third anticollision unit 114.3 and the fourth anticollision unit 114.4 can be designed and arranged in the same way as described above for the pairing including the first anticollision unit 114.1 and the second anticollision unit 114.2. In particular, here too, the measures described above can be used to achieve a sufficiently late but timely start of the counter-force effect CF3, CF4 that prevents a collision of the third collision region 108.2 and the fourth collision region 109.2 for the maximum disturbance $MS_i$ to be expected. To this extent, initially, reference is expressly made in this respect to the statements made above.

In the present example, the third anticollision unit 114.3 and the fourth anticollision unit 114.4 therefore, again, include a plurality of anticollision elements 115.1 115.2 producing partial fields TF1, TF2. Here too, the further anticollision elements 115.1, 115.2 are assigned to one another in such a way that the superimposition of further partial fields TF1, TF2 produce a further field F3 and F4, respectively, of the anticollision unit 114.3, 114.4, respectively, with a field line density that decreases more sharply with increasing distance from the anticollision unit 114.3 and 114.4, respectively, along the path of relative movement $R_i$ than a field line density of one of the further partial fields TF1, TF2. Thus, here too, the concentration of the field lines described above in the vicinity of the respective anticollision unit 114.3, 114.4, and the previously described sharp decrease of the field line density with increasing distance from the respective anticollision unit 114.3, 114.4, respectively, is advantageously achieved.

Here too, the third anticollision unit 114.3 is arranged directly in the third collision region 108.2, while the fourth anticollision unit 114.4 is arranged directly in the fourth collision region 109.2.

As already mentioned above, it may suffice that a design is created for a certain maximum disturbance $MS_1$ to be expected. This may be the case, in particular, whenever all other disturbances to be expected do not lead to a collision. Here, without the counter-force effect of the anticollision units 114.1 to 114.4 along the path of relative movement $R_1$, the same disturbance $MS_1$ to be expected as a maximum may lead both to collisions in the region of the first collision region 108.1 and the second collision region 109.1 and in the region of the third collision region 108.2 and the fourth collision region 109.2. The collisions may occur simultaneously or sequentially.

In the present example, however, different disturbances $MS_1$ and $MS_2$, in particular disturbances $MS_1$ and $MS_2$ in different directions, may also lead to different paths of relative movement $R_1$ and $R_2$. In this case, one of the disturbances $MS_1$ may lead to a collision in the region of the first collision region 108.1 and the second collision region 109.1, while the other disturbance $MS_2$ may lead to a collision in the region of the third collision region 108.2 and the fourth collision region 109.2. In the present example, the further mechanical disturbance $MS_2$ is therefore different at least in its direction of effect from the first mechanical disturbance $MS_1$ and the supporting structure defines the further, second path of relative movement $R_2$ of the first facet element 108, which is different from the first path of relative movement $R_1$ and on which the first facet element 108 moves along a further direction of approach AR2 in relation to the second facet element 109 under the influence of the further mechanical disturbance $MS_2$ (in particular a further shock).

The relative movement and the avoidance of collisions between the facet elements 108 and 109 has been described above. Similarly or identically designed pairs of anticollision units 114.1, 114.2 and 114.3, 114.4, respectively, may be provided between all or a number of the facet elements of the facet mirror 106.1, as can be seen in particular in FIG. 3. The second component may, however, also be another component of the optical module 106.1, in particular a component 112.4 of the supporting structure 112 that is located adjacent to a facet element, as is shown in FIG. 3 for the facet element 110 and the component 112.4 of the supporting structure 112. Similarly or identically designed pairs of anticollision units 114.1, 114.2 and 114.3, 114.4, respectively, are likewise provided between the facet element 110 and the component 112.4.

It also goes without saying that the counter-force effect of the anticollision units 114.1 to 114.4 is available or comes into effect at any desired times during operation but also during transportation of the optical module 106.1. The advantages take effect particularly well, in particular, when transporting the facet mirror 106.1 (alone or, for example, installed in the illumination device 102 or the projection device 103), when there is a higher risk of unintentional disturbances $MS_i$ in the form of shocks or the like. But also during operation of the facet mirror 106.1 in the imaging device 101 the advantages of the disclosure can advantageously take effect in the event of disturbances, such as, in particular, earth tremors.

Second Embodiment

A further preferred embodiment of the optical module 206.1 according to the disclosure, which can be used instead of the optical module 106.1 in the imaging device 101, is described below with reference to FIGS. 1 to 9. The optical module 206.1, in its basic design and the way in which it functions, corresponds to the optical module from FIGS. 2 to 8, and so only the differences are to be discussed here. In particular, identical components are provided with identical reference numerals, while similar components are provided with reference numerals increased by the value 100. Unless otherwise stated below, reference is made to the statements made above in the context of the first embodiment with regard to the features, functions and advantages of these components.

Figure 9:
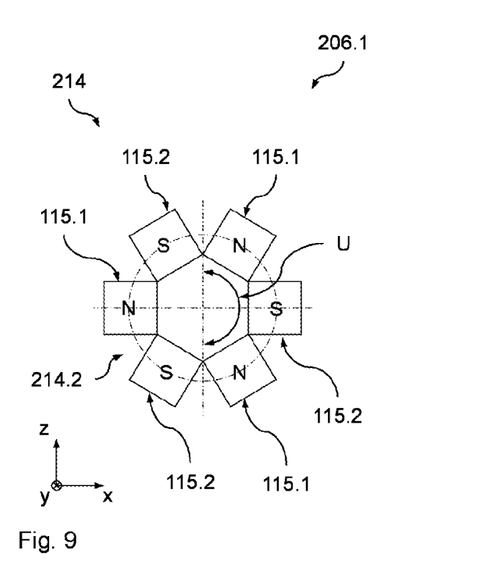
FIG. 9 is a schematic enlarged view of an anticollision unit of a further preferred embodiment of an optical module according to the disclosure in a view similar to FIG. 8.

The only difference with respect to the optical module 106.1 is that, with the optical module 206.1, instead of the anticollision units 114.1 to 114.4, anticollision units, such as they are represented in FIG. 9 by way of the example of the anticollision unit 214.2, are respectively used for the anticollision device 214.

As can be seen from FIG. 9, the anticollision unit 214.2 again is an annular arrangement of a plurality of anticollision elements 115.1, 115.2 producing partial fields TF1, TF2. In the present example, N=6 anticollision elements 115.1, 115.2, more precisely, three anticollision elements 115.1 and three anticollision elements 115.2, are provided for the first anticollision unit (not represented). The same applies to the second anticollision unit 214.2 with M=6 anticollision elements 115.1, 115.2, more precisely, three anticollision elements 115.1 and three anticollision elements 115.2.

The anticollision elements 115.1, 115.2 are respectively arranged in a so-called hexapole configuration and, in each case, produce a partial field TF1 or TF2, respectively (as explained above on the basis of FIG. 7). The anticollision elements 115.1, 115.2 are assigned to one another in such a way that the superimposition of their partial fields TF1 and TF2 produces the real field F1 and F2, respectively.

Here, the anticollision elements 115.1, 115.2 of the anticollision unit 214.2 are arranged along a circumferential direction U of the annular arrangement in such a way that they alternately have substantially opposed inner polarites IP1, IP2 with substantially parallel inner field directions IFR1, IFR2. Consequently, here too, the anticollision elements 115.1, 115.2 are arranged with alternating polarities IP1, IP2 of the inner field directions IFR1, IFR2. In the view of FIG. 9, therefore, an anticollision element 115.1 with a magnetic north pole (on the surface facing the first anticollision unit) is respectively followed, along the circumferential direction U, by an anticollision element 115.2 with a magnetic south pole (on the surface facing the first anticollision unit), and vice versa.

Here too, the superimposition of the partial fields TF1, TF2 of the anticollision elements 115.1, 115.2 can have the effect of achieving the desired short-rangedness of the two fields F1 and F2 and it can in this way be ensured that an appreciable counter-force effect CF1 or CF2 only occurs when the two facet elements 108 and 109 approach each other highly closely, while normal adjusting movements between the two facet elements 108 and 109 are not hindered by such a counter-force effect.

More precisely, with the six anticollision elements 115.1, 115.2 of the anticollision unit 214.2 the hexapole configuration provides a field line density of the fields F1 and F2, respectively, that decreases along the direction of approach $AR_i$ with the distance from the anticollision unit 214.2 approximately by a power of 7. The decrease of the field line density is therefore sharper here than in the case of the previous embodiment with the quadrupole configuration, and so the range of the fields F1 and F2 is even smaller.

Third Embodiment

A further preferred embodiment of the optical module 306.1 according to the disclosure, which can be used instead of the optical module 106.1 in the imaging device 101, is described below with reference to FIGS. 1 to 8 and 10. The optical module 306.1, in its basic design and the way in which it functions, corresponds to the optical module from FIGS. 2 to 8, and so only the differences are to be discussed here. In particular, identical components are provided with identical reference numerals, while similar components are provided with reference numerals increased by the value 200. Unless otherwise stated below, reference is made to the statements made above in the context of the first embodiment with regard to the features, functions and advantages of these components.

Figure 10:
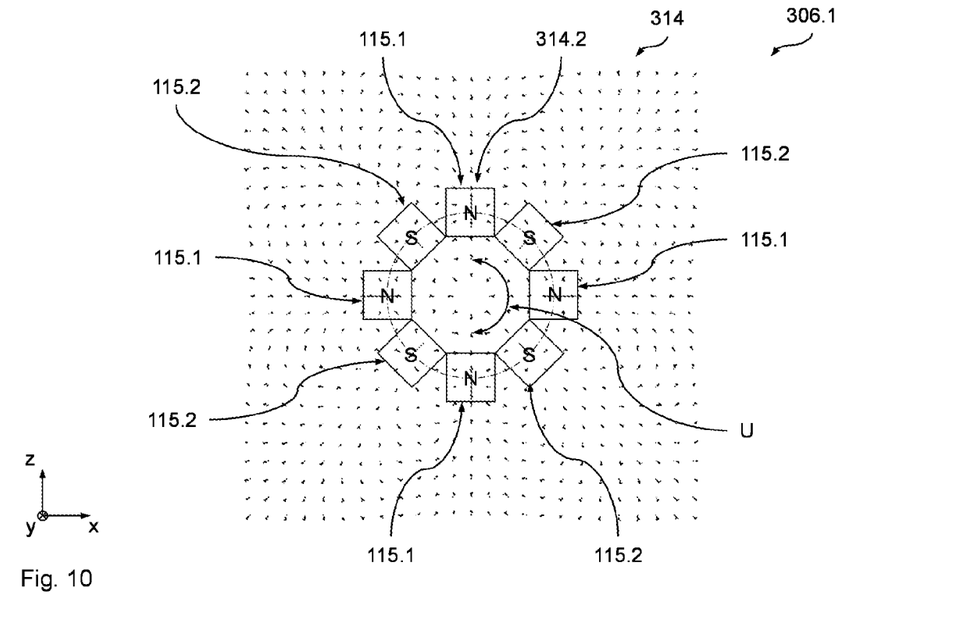
FIG. 10 is a schematic enlarged view of an anticollision unit of a further preferred embodiment of an optical module according to the disclosure in a view similar to FIG. 8 to represent the real pattern of the field lines.

The only difference with respect to the optical module 106.1 is that, in the case of the optical module 306.1, instead of the anticollision units 114.1 to 114.4, anticollision units, such as they are represented in FIG. 10 by way of the example of the anticollision unit 314.2, are respectively used for the anticollision device 314.

As can be seen from FIG. 10, the anticollision unit 314.2 again is an annular arrangement of a plurality of anticollision elements 115.1, 115.2 producing partial fields TF1, TF2. In the present example, N=8 anticollision elements 115.1, 115.2, more precisely four anticollision elements 115.1 and four anticollision elements 115.2, are provided for the first anticollision unit (not represented). The same applies to the second anticollision unit 214.2 with M=8 anticollision elements 115.1, 115.2, more precisely four anticollision elements 115.1 and four anticollision elements 115.2. FIG. 10 shows the pattern and the direction of the field lines, respectively, at certain points in a plane parallel to the xz plane.

The anticollision elements 115.1, 115.2 are respectively arranged in a so-called octupole configuration and in each case produce a partial field TF1 and TF2, respectively (as explained above on the basis of FIG. 7). The anticollision elements 115.1, 115.2 are assigned to one another in such a way that the superimposition of their partial fields TF1 and TF2 produces the real field F1 and F2, respectively.

Here, the anticollision elements 115.1, 115.2 of the anticollision unit 314.2 are arranged along the circumferential direction U of the annular arrangement in such a way that they alternately have substantially opposed inner polarites IP1, IP2 with substantially parallel inner field directions IFR1, IFR2. Consequently, here too, the anticollision elements 115.1, 115.2 are arranged with alternating polarities IP1, IP2 of the inner field directions IFR1, IFR2. In the view of FIG. 10, therefore, an anticollision element 115.1 with a magnetic north pole (on the surface facing the first anticollision unit) is respectively followed along the circumferential direction U by an anticollision element 115.2 with a magnetic south pole (on the surface facing the first anticollision unit), and vice versa.

Here too, the superimposition of the partial fields TF1, TF2 of the anticollision elements 115.1, 115.2 can have the effect of achieving the desired short-rangeness of the two fields F1 and F2 and it can herewith be ensured that an appreciable counter-force effect CF1 or CF2 only occurs when the two facet elements 108 and 109 approach each other highly closely, while normal adjusting movements between the two facet elements 108 and 109 are not hindered by such a counter-force effect.

More precisely, with the eight anticollision elements 115.1, 115.2 of the anticollision unit 214.2 the octupole configuration provides a field line density of the fields F1 and F2, respectively, that decreases along the direction of approach $AR_i$ with the distance from the anticollision unit 214.2 approximately by a power of 9. The decrease of the field line density is therefore even sharper here than in the case of the two previous embodiments with the quadrupole configuration (FIG. 8) and the hexapole configuration (FIG. 9), and so the range of the fields F1 and F2 is even smaller.

The present disclosure was described above exclusively on the basis of an example from the area of microlithography. However, it goes without saying that the disclosure can also be used in connection with any other desired optical applications, in particular imaging methods at other wavelengths.

The disclosure can also be used in connection with the inspection of objects, such as for example so-called mask inspection, in which the masks used for microlithography are inspected for their integrity, etc. In FIG. 1, a sensor unit for example, which senses the imaging of the projection pattern of the mask 104.1 (for further processing), then takes the place of the substrate 105.1. This mask inspection may then take place both substantially at the same wavelength as is used in the later microlithographic process. However, it is likewise also possible to use any desired wavelengths deviating therefrom for the inspection.

Finally, the present disclosure was described above on the basis of a specific embodiment, which shows specific combinations of the features defined in the following patent claims. It is explicitly noted at this point that the subject matter of the present disclosure is not restricted to these combinations of features but that the subject matter of the present disclosure also includes all other combinations of features, as they emerge from the subsequent patent claims.

What is claimed is:

1. An optical module, comprising:
a first component;
a second component;
a supporting structure; and
an anticollision device,
wherein:
the first component is supported by the supporting structure;
the first component is arranged a distance from the second component to define a gap;
the supporting structure is configured to define a path of relative movement of the first component;
the first component is configured to move along the path of relative movement in a direction of approach relative to the second component under an influence of a defined mechanical disturbance;
the optical module is configured so that, when the anticollision device is absent or inactive, a collision between a first collision region of the first component and a second collision region of the second component occurs;
the anticollision device comprises a first anticollision unit on the first component and configured to produce a first field;
the anticollision device comprises a second anticollision unit on the second component, assigned to the first anticollision unit and configured to produce a second field;
the first and second anticollision units are configured so that, as the first component and the second component increasingly approach each other along the path of relative movement, the first field and the second field produce an increasing counter-force on the first component that counteracts the approach;
the first anticollision unit and/or the second anticollision unit comprises a plurality of anticollision elements configured to produce partial fields; and
the anticollision elements are assigned to each other so that, during use, a superimposition of their partial fields produces a field of the anticollision unit with a field line density that decreases more sharply with increasing distance from the anticollision unit along the path of relative movement than a field line density of one of the partial fields.

2. The optical module of claim 1, wherein the optical module is configured so that, during use, at least one of the following holds:
the field line density of the field of the anticollision unit decreases exponentially with the distance from the anticollision unit;
the field line density of the field of the anticollision unit decreases with the distance from the anticollision unit by a power of from five to 21; and
the superimposition of the partial fields of the anticollision unit produces a real field which, in interaction with a predefined counter-field, produces a predefined counter-force on the first component only at a distance between the first collision region and the second collision region which is smaller than in a theoretical reference state, for which the amounts of the theoretical partial forces that are obtained in the direction of approach from the respective partial field without the superimposition of the partial fields are added together.

3. The optical module of claim 1, wherein the first anticollision unit comprises N first anticollision elements, the second anticollision unit comprises M second anticollision elements, and at least one of the following holds:
N is equal to M;
N and/or M is an even number;
N equals 2 to 20; and
M equals 2 to 20.

4. The optical module of claim 1, wherein the optical module is configured so that, during use, at least one of the following holds:
the anticollision elements of at least one of the anticollision units, in their interior, define an inner field direction of the partial field with an inner polarity;

the anticollision elements of the at least one anticollision unit are arranged in a substantially annular arrangement in a plane extending transversely; and the anticollision elements of the at least one anticollision unit are arranged in a substantially annular arrangement in a plane perpendicular to the inner field direction of one of the anticollision elements.

5. The optical module of claim 4, wherein the optical module is configured so that, during use, at least one of the following holds:

at least two anticollision elements of the at least one anticollision unit are arranged along a circumferential direction of the annular arrangement so that they have a substantially opposed inner polarity;

the anticollision elements of the at least one anticollision unit, at least section wise along a circumferential direction of the annular arrangement, are arranged with alternating polarity of the inner field direction; and the inner field directions of at least two anticollision elements of the at least one anticollision unit are substantially parallel.

6. The optical module of claim 1, wherein the optical module is configured so that, during use:

in a state of rest without any influence of the mechanical disturbance, the first and second collision regions are at an at-rest distance along the direction of approach;

the first and second anticollision units produce a negligible first counter-force on the first component;

for the first and second collision regions, there is a predefined minimum distance along the direction of approach, below which the approach must not go under the effect of the mechanical disturbance and at which the first and second anticollision units produce a second counter-force on the first component; and for the first and second collision regions, there is an intermediate distance along the direction of approach which is achieved under the effect of the mechanical disturbance, which lies between the at-rest distance and the minimum distance and at which the first and second anticollision units produce a third counter-force on the first component that is not negligible and has a magnitude between the first counter-force and the second counter-force.

7. The optical module of claim 6, wherein the optical module is configured so that, during use, at least one of the following holds:

the minimum distance is 3% to 20% of the at-rest distance;

the intermediate distance is 20% to 70% of the at-rest distance;

the at-rest distance is 0.2 mm to 1.0 mm;

the minimum distance is 0.015 mm to 0.1 mm; and the intermediate distance is 0.2 mm to 0.02 mm.

8. The optical module of claim 7, wherein wherein the optical module is configured so that, during use, at least one of the following holds:

the first counter-force is less than 3% to 20 of the second counter-force;

the third counter-force is less than 20% to 70% of the second counter-force; and the third counter-force is 350% to 750% of the first counter-force.

9. The optical module of claim 6, wherein wherein the optical module is configured so that, during use, at least one of the following holds:

the first counter-force is less than 3% to 20 of the second counter-force;

the third counter-force is less than 20% to 70% of the second counter-force; and the third counter-force is 350% to 750% of the first counter-force.

10. The optical module of claim 1, wherein wherein the optical module is configured so that, during use:

the path of relative movement, at every point, defines a distance between the first and second collision regions along the direction of approach;

for the first and second components, a minimum distance of the first and second collision regions in the direction of approach is predefined, below which the approach must not go under the effect of the mechanical disturbance; and the counter-force produced by the first and second anticollision units on the first component, which counteracts the approach caused by the mechanical disturbance, reduces a relative speed between the first and second collision regions along the direction of approach to a value of zero at the latest when the minimum distance is reached.

11. The optical module of claim 1, wherein the first anticollision unit is in the region of the first collision region, and the second anticollision unit is in the region of the second collision region.

12. The optical module of claim 11, wherein the third anticollision unit is in the region of the third collision region, and the fourth anticollision unit is in the region of the fourth collision region.

13. The optical module of claim 11, wherein the optical module is configured so that, during use:

the further mechanical disturbance is different at least in its direction of effect from that of the mechanical disturbance; and the supporting structure defines the further path of relative movement of the first component, which is different from the path of relative movement and on which the first component moves along a further direction of approach in relation to the second component under the influence of the further mechanical disturbance.

14. The optical module of claim 1, wherein the optical module is configured so that, during use:

the anticollision device comprises a third anticollision unit located a distance from the first anticollision unit;

the third anticollision unit is on the first component;

the third anticollision unit produces a third field;

the anticollision device comprises a fourth anticollision unit located a distance from the second anticollision unit;

the fourth anticollision unit is on the second component;

the fourth anticollision unit is is assigned to the third anticollision unit;

the fourth anticollision produces a fourth field;

when the anticollision device is absent or inactive, a collision between a third collision region of the first component and a fourth collision region of the second component occurs under the influence of the mechanical disturbance and/or a further mechanical disturbance; and the third and fourth anticollision unit and the fourth anticollision units are configured so that, with an increasing approach of the third and fourth collision regions along the path of relative movement or along a further path of relative movement, the third and fourth fields produce an increasing further counter-force on the first component that counteracts the approach.

15. The optical module of claim 14, wherein the optical module is configured so that, during use:
- the third anticollision unit and/or the fourth anticollision unit comprises a plurality of further anticollision elements that produce further partial fields; and
- the further anticollision elements are assigned to each other so that the superimposition of their further partial fields produces a further field of the anticollision unit with a field line density that decreases more sharply with increasing distance from the anticollision unit along the path of relative movement than a field line density of one of the further partial fields.

16. The optical module of claim 14, wherein the third anticollision unit is in the region of the third collision region, and the fourth anticollision unit is in the region of the fourth collision region.

17. The optical module of claim 14, wherein the optical module is configured so that, during use:
- the further mechanical disturbance is different at least in its direction of effect from that of the mechanical disturbance; and
- the supporting structure defines the further path of relative movement of the first component, which is different from the path of relative movement and on which the first component moves along a further direction of approach in relation to the second component under the influence of the further mechanical disturbance.

18. The optical module of claim 1, wherein at least one of the following holds:
- during use, at least one of the anticollision elements of at least one of the anticollision units produces a magnetic partial field and/or an electric partial field; and
- at least one of the anticollision elements of at least one of the anticollision units comprises a permanent magnet.

19. An optical imaging device, comprising:
an illumination device comprising a first optical element group;
a projection device comprising a second optical element group; and
an image device,
wherein:
- the illumination device is configured to illuminate an object;
- the projection device is configured to project an image of the illuminated object onto the image device;
- the illumination device and/or the projection device comprises an optical module according to claim 1; and
- the optical imaging device is a microlithography optical imaging device.

20. A method of using an optical device comprising an illumination device, a projection device and an image device, the method comprising:
using the illumination device to illuminate an object; and
using the projection device to project the illuminated object onto the image device,
wherein the illumination device and/or the projection device comprises an optical module according to claim 1.

* * * * *